(12) United States Patent  
Engquist et al.

(10) Patent No.: US 6,857,898 B2  
(45) Date of Patent: Feb. 22, 2005

(54) APPARATUS AND METHOD FOR LOW-PROFILE MOUNTING OF A MULTI-CONDUCTOR COAXIAL CABLE LAUNCH TO AN ELECTRONIC CIRCUIT BOARD

(75) Inventors: David T. Engquist, Portland, OR (US); J. Steve Lyford, Portland, OR (US); Devin Bingham, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/627,100

(22) Filed: Jul. 24, 2003

(65) Prior Publication Data

US 2004/0072468 A1 Apr. 15, 2004

Related U.S. Application Data

(60) Provisional application No. 60/399,101, filed on Jul. 25, 2002.

(51) Int. Cl.[7] .............................................. H01R 12/24
(52) U.S. Cl. ...................................... 439/493; 439/497
(58) Field of Search ................................ 439/493, 497, 439/498, 63, 579, 581

(56) References Cited

U.S. PATENT DOCUMENTS

| 5,478,258 A | * | 12/1995 | Wang | 439/581 |
| 5,532,659 A | * | 7/1996 | Dodart | 333/260 |
| 6,007,347 A | * | 12/1999 | Keldsen et al. | 439/63 |
| 6,575,762 B2 | * | 6/2003 | Evans | 439/63 |
| 6,661,318 B2 | * | 12/2003 | Tamaki et al. | 333/260 |

* cited by examiner

Primary Examiner—Tho D. Ta  
Assistant Examiner—X. Chung-Trans  
(74) Attorney, Agent, or Firm—Moser, Patterson & Sheridan LLP; Francis I. Gray

(57) ABSTRACT

Method and apparatus for launching a coaxial cable onto a circuit board is described. In an example, a circuit board includes a front edge and a major surface. The major surface includes a recessed portion open to the front edge, the recessed portion being defined by a stop surface, opposing side surfaces, and a bottom surface. A plurality of conductive pads is disposed on the major surface. A conductive layer is disposed on at least a portion of the bottom surface. The recessed portion is adapted to receive a multiple conductor ribbon cable to provide thereby low-profile communication of the multiple conductor ribbon cable and the circuit board. The multiple conductor ribbon cable having a plurality of first conductors and a plurality of second conductors respectively associated with the plurality of first conductors. The plurality of conductive pads are adapted to receive respective first conductors of the multiple conductor ribbon cable. The conductive layer is adapted to receive respective second conductors of the multiple conductor ribbon cable.

17 Claims, 3 Drawing Sheets

APPARATUS AND METHOD FOR LOW-PROFILE MOUNTING OF A MULTI-CONDUCTOR COAXIAL CABLE LAUNCH TO AN ELECTRONIC CIRCUIT BOARD

CROSS-REFERENCE TO RELATED APPLICATIONS

This applications claims benefit of U.S. provisional patent application Ser. No. 60/399,101, filed Jul. 25, 2002, which is incorporated by reference herein in its entirety.

BACKGROUND OF THE INVENTION

1. Field of the Invention

The present invention generally relates to mounting components to a circuit board and, more particularly, to low-profile mounting of a multi-conductor coaxial cable launch to an electronic circuit board.

2. Description of the Related Art

Physical space within the enclosures of electronic devices is often limited. For a given electronic device, the size of the enclosure may impose restrictions on the physical sizes of electronic circuit boards, as well as a restriction on the number of electronic circuit boards housed within the enclosure. For example, it is often desirable to include diagnostic interface circuitry within an electronic device to allow connection to various diagnostic devices, such as oscilloscopes and logic analyzers. However, since space within the enclosure is at a premium, it is desirable to take up as little of that space as possible with the diagnostic interface circuitry to leave more room for the principle circuitry of the electronic device.

Diagnostic devices are increasingly being connected with electronic devices using coaxial cable. Creating a junction between coaxial cables and electronic circuit boards has provided a well known challenge. In particular, for a multi-conductor coaxial cable, a typical interconnect ("launch") involves mounting the multi-conductor coaxially cable to the top surface of the circuit board. The center conductors of the multi-conductor coaxially cable are formed downward during soldering to individual conductive pads on the circuit board surface. The outer conductors of the multi-conductor coaxial cable are soldered to a single long pad connected to a ground. However, the profile of this interconnect may be too large for some enclosures. Notably, the distance from the top of the multi-conductor coaxial cable to the bottom of the circuit board may prevent the circuit board from fitting within the enclosure. It is thus desirable to provide a coaxial cable launch on a circuit board that exhibits a lower profile.

SUMMARY OF THE INVENTION

These and other deficiencies of the prior art are addressed by the present invention of a method and apparatus for launching a coaxial cable onto a circuit board. In one embodiment, a circuit board includes a front edge and a major surface. The major surface includes a recessed portion open to the front edge, the recessed portion being defined by a stop surface, opposing side surfaces, and a bottom surface. A plurality of conductive pads is disposed on the major surface. A conductive layer is disposed on at least a portion of the bottom surface. The recessed portion is adapted to receive a multiple conductor ribbon cable to provide thereby low-profile communication of the multiple conductor ribbon cable and the circuit board. The multiple conductor ribbon cable having a plurality of first conductors and a plurality of second conductors respectively associated with the plurality of first conductors. The plurality of conductive pads are adapted to receive respective first conductors of the multiple conductor ribbon cable. The conductive layer is adapted to receive respective second conductors of the multiple conductor ribbon cable.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
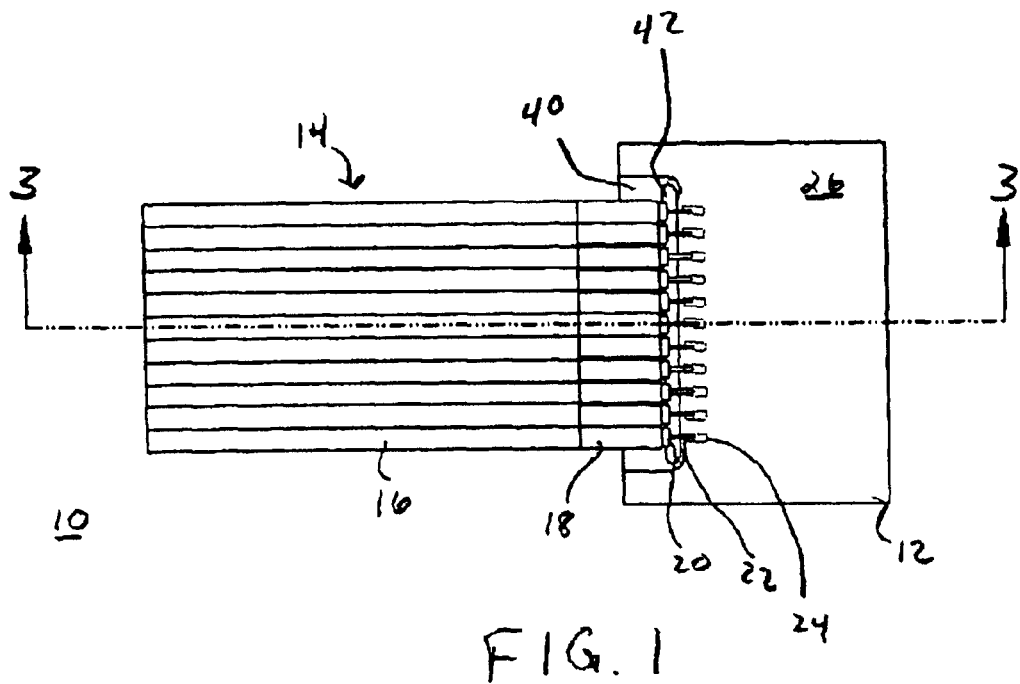
FIG. 1 is a plan view depicting an exemplary embodiment of a multi-conductor coaxial cable launch in accordance with the invention.
Figure 2:
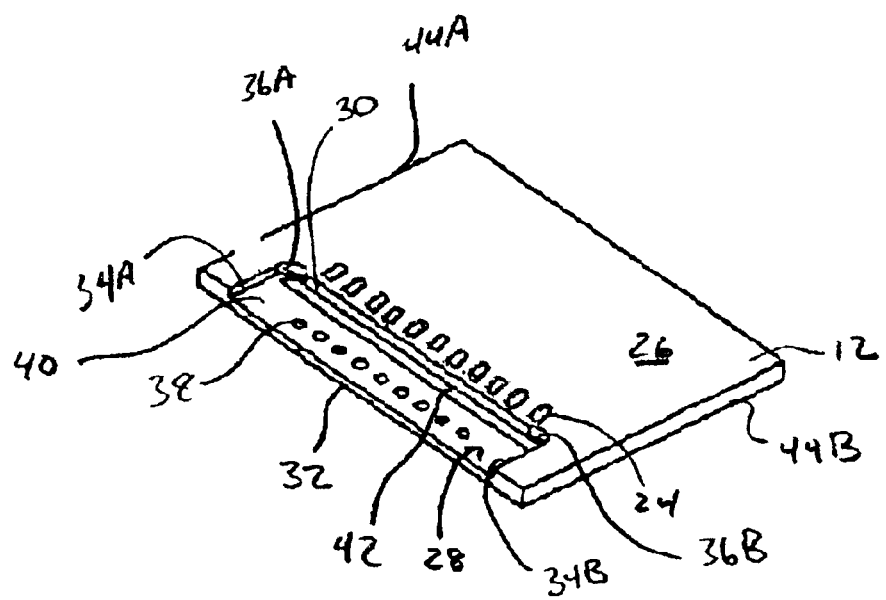
FIG. 2 is an isometric view depicting an exemplary embodiment of a circuit board of the coaxial cable launch of FIG. 1.
Figure 3:
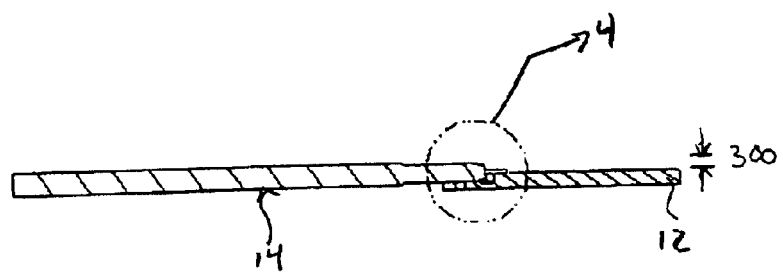
FIG. 3 is a cross-sectional view of the coaxial cable launch of FIG. 1 taken along the line 3—3.
Figure 4:
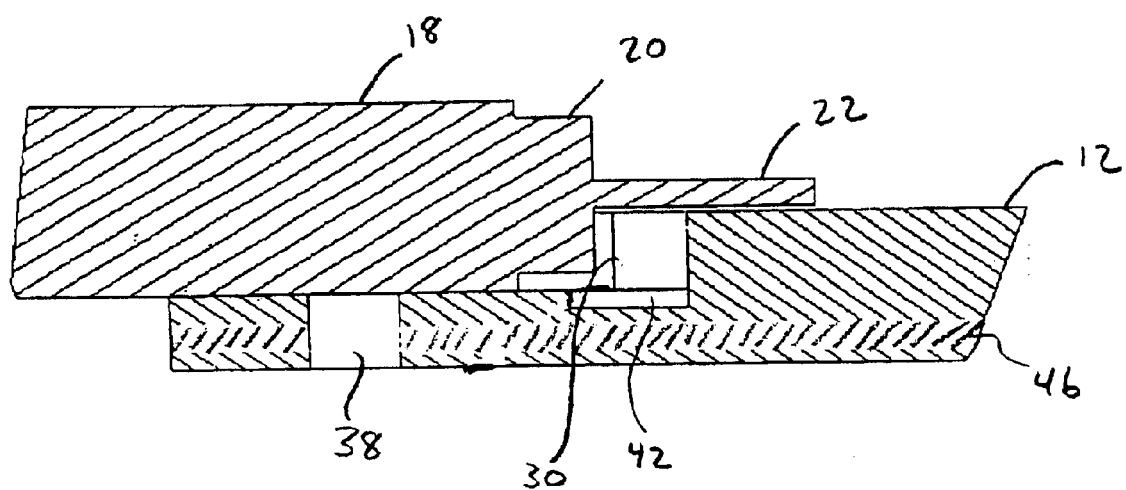
FIG. 4 is an enlarged cross-sectional view of the coaxial cable launch of FIG. 1 taken within the circle 4 of FIG. 3.

FIG. 1 is a plan view depicting an exemplary embodiment of a multi-conductor coaxial cable launch 10 in accordance with the invention. The launch 10 comprises a multi-conductor coaxial cable ("coaxial cable 14") mounted to a portion of a circuit board 12. For purposes of clarity, only a portion of the circuit board 12 is shown. In general, the circuit board 12 may include various circuit elements and may be configured to be mounted within an electronic instrument. FIG. 2 is an isometric view depicting an exemplary embodiment of the circuit board 12 in accordance with the invention. FIG. 3 is a cross-sectional view of the launch 10 taken along the line 3—3 of FIG. 1. FIG. 4 is an enlarged cross-sectional view of the launch 10 taken within the circle 4 of FIG. 3. The invention may be more thoroughly understood with simultaneous reference to FIGS. 1–4.

In one embodiment, the circuit board 12, which may be a printed circuit board (PCB) or an electronic circuit board (ECB), comprises opposing side edges 44A and 44B, a front edge 32, a major surface 26, and a plurality conductive pads 24 (e.g., 11 are shown) disposed on the major surface 26. The conductive pads 24 may be further connected to additional circuit board traces and circuit elements (not shown) that are disposed on the circuit board 12.

The coaxial cable 14 comprises a plurality of center conductors 22 (e.g., 11 are shown). Each of the center conductors 22 is surrounded by an insulator layer 20, which is surrounded by an outer conductor 18. The outer conductor 18 may comprise, for example, a multiplicity of conductive strands woven into a cylindrical braid surrounding the insulator layer 20. The outer conductor 18 is surrounded by an insulator sleeve 16. In an embodiment, the insulator sleeve 16 may surround each of the center conductors 22 to form a "ribbon" coaxial cable. A free end of each of the center conductors 22 is stripped of insulation and extends beyond the outer conductor 18 and insulator layer 20. The free end of each of the center conductors 22 rests on a respective one of the conductive pads 24, and may be soldered for an electrical and mechanical connection thereto. The center conductors 22 of the coaxial cable 14 are closely spaced, typically ranging from as small as 0.030 inches to over 0.100 inches between center conductors.

To facilitate a low-profile connection between the coaxial cable 14 and the circuit board 12, the circuit board 12 includes a recessed portion ("pocket 28"). The pocket 28 is defined by a stop surface 30 perpendicular to the major surface 26 of the circuit board 12, and opposing sides 34A and 34B that extend from the front edge 32 of the circuit board 12 to the stop surface 30. The pocket 28 is open to the front edge 32 of the circuit board 12. The stop surface 30 is positioned proximate the conductive pads 24. The opposing sides 34A and 34B of the pocket 28 are parallel to the opposing sides 44A and 44B of the circuit board 12. Notches 36A and 36B are disposed between respective opposing sides 34A and 34B and opposing ends of the stop surface 30. The notches 36A and 36B allow a router bit to machine a straight edge on the stop surface 30. The pocket includes a bottom surface 40 that is parallel to the major surface 26 of the circuit board 12. The width of the pocket 28 between the opposing sides 34A and 34B is such that there is adequate room for the coaxial cable 14 to rest therein. The coaxial cable 14 may enter the pocket 28 from the front edge 32. The insulator layer 20 of each of the center conductors 22 substantially abuts the stop surface 30. In addition, the depth of the pocket 28 is such that the center conductors 22 are substantially parallel with the major surface 26.

As described in more detail below, in one embodiment, the pocket 28 is plated with a conductive material, with the exception of the stop surface 30 and a portion 42 of the bottom surface 40 that extends at least the length of the stop surface 30 between the opposing sides 34A and 34B. The stop surface 30 and the portion 42 electrically isolate the center conductors 22 from the bottom surface 40 of the pocket 28. This prevents the shorting of the center conductors 22 to the plating on the bottom surface 40 which, as described below, is electrically connected to ground. In another embodiment, the pocket 28 is plated with a conductive material, with the exception of the stop surface 30, the portion 42 of the bottom surface 40, opposing sides 34A and 34B, and notches 36A and 36B.

A ground plane 46 (shown in FIG. 4) is provided by a conductive sheet sandwiched at an intermediate level within the circuit board 12. The ground plane 46 largely extends across the entire circuit board 12 parallel to the major surface 26 thereof and spaced away from the bottom surface 40 of the pocket 28. One or more plated through-holes ("vias 38") (e.g., nine are shown) extend perpendicularly between the bottom surface 40 and the ground plane 46. The vias 38 are plated with a conductive material and electrically connect conductive plating on the bottom surface 40 with the ground plane 46. The outer conductor 18 surrounding each of the central conductors 22 may be soldered to the plating on the bottom surface 40 of the pocket 28 for an electrical and mechanical connection thereto.

As shown in FIG. 3, the profile 300 of the launch 10 is lower than conventional coaxial cable launches, where the coaxial cable is mounted directly to the major surface of the circuit board. Notably, since the coaxial cable 14 is recessed in the pocket 28, the distance from the top of the coaxial cable 14 to the major surface 26 of the circuit board 12 is reduced. For example, in a conventional arrangement, the distance from the top of the coaxial cable to the major surface of the circuit board may be as much as 0.055 inches. With the invention, however, the same distance may be approximately 0.030 inches. This allows the launch 10 to fit in electronic enclosures having a limited amount of physical space and advantageously allows the launch 10 to fit within a larger population of electronic enclosures than conventional coaxial cable launches. In addition, the low profile of the coaxial cable launch 10 allows a greater number of such coaxial cable launches 10 to fit within a single electronic enclosure.

Figure 5A:
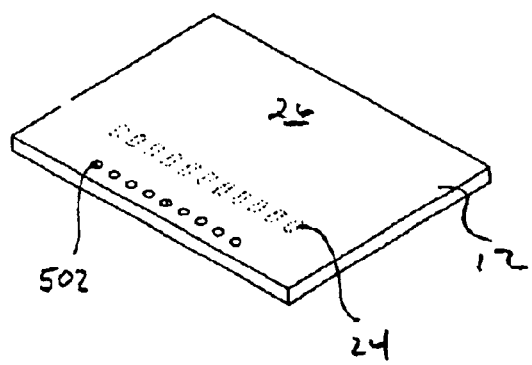
FIGS. 5A through 5D depict a process of forming the coaxial cable launch of FIG. 1.

FIGS. 5A through 5D depict a process of forming the coaxial cable launch 10 of the present invention. Elements that are the same or similar to elements shown in FIGS. 1 through 4 are designated with identical reference numerals and are described in detail above. As shown in FIG. 5A, one or more holes 502 (e.g., nine are shown) are drilled in the circuit board 12 in the area where the pocket 28 will reside. The circuit board 12 may be prepared in accordance with conventional manufacturing processes. Briefly stated, the ground plane and other inner layers are etched laminated together to form the circuit board 12. The holes 502 extend through the circuit board 12 at least as deep as a ground plane within the circuit board 12.

Figure 5B:
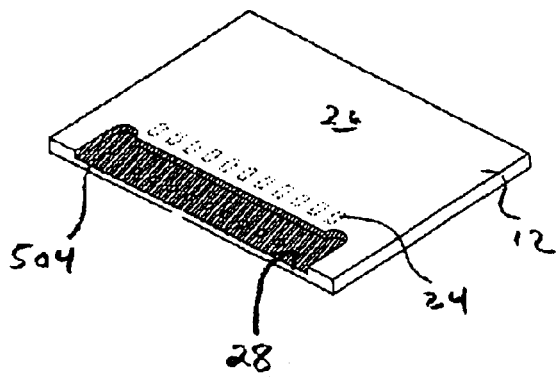

As shown in FIG. 5B, after drilling the holes 502, the circuit board 12 is routed to form the pocket 28. The circuit board 12 is then subject to a plating process well-known in the art to form a plated area 504 within the pocket 28. Briefly stated, areas of the circuit board 12 that do not need plating are covered with a resist. No resist is applied to the pocket 28 so that the bottom surface 40, the opposing sides 34A and 34B, the stop surface 30, and the notches 36A and 36B of the pocket 28 are plated with a conductive material to form the plated area 504. In addition, the holes 502 are through-hole plated to form the vias 38. In another embodiment, the opposing sides 34A and 34B and the notches 36A and 36B are not plated with a conductive material such that only a portion of the bottom surface 40 is plated.

Figure 5C:
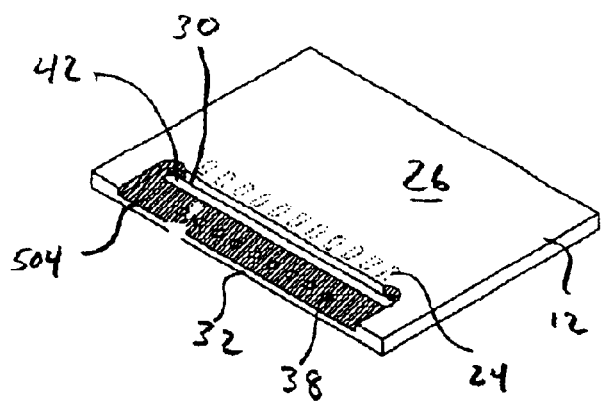

As shown in FIG. 5C, after plating, portions of the plated area 504 are removed in another routing step. Notably, plating is removed from the stop surface 30 and the portion 42 of the bottom surface 40 that extends at least the length of the stop surface 30 between the opposing sides 34A and 34B. As described above, this allows the center conductors 22 of the coaxial cable 14 to be electrically isolated from the bottom surface 40 of the pocket 28.

Figure 5D:
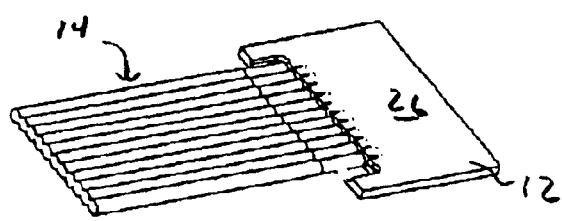

Finally, as shown in FIG. 5D, the coaxial cable 14 is attached to the circuit board 12 within the pocket 28. Notably, the center conductors 22 are soldered to the conductive pads 24 to provide an electrical and mechanical connection thereto. The outer conductor 18 of each of the center conductors 22 is soldered to the plated area 504 covering the bottom surface 40 of the pocket 28 to provide an electrical and mechanical connection thereto. In this manner, the outer conductor 18 of each of the center conductors 22 is electrically coupled to the ground plane 46 within the circuit board 12.

While the foregoing is directed to illustrative embodiments of the present invention, other and further embodiments of the invention may be devised without departing from the basic scope thereof, and the scope thereof is determined by the claims that follow.

What is claimed is:

1. An apparatus, comprising:
   a circuit board having a front edge and a major surface, the major surface having a recessed portion open to the front edge, the recessed portion being defined by a stop surface, opposing side surfaces, and a bottom surface;
   a plurality of conductive pads disposed on the major surface; and
   a conductive layer disposed on at least a portion of the bottom surface;
   the recessed portion adapted to receive a multiple conductor ribbon cable to provide thereby low-profile communication of the multiple conductor ribbon cable and the circuit board, the multiple conductor ribbon cable having a plurality of first conductors and a plurality of second conductors respectively associated with the plurality of first conductors;
   the plurality of conductive pads being adapted to receive respective first conductors of the multiple conductor ribbon cable;
   said conductive layer adapted to receive respective second conductors of the multiple conductor ribbon cable.

2. The apparatus of claim 1, wherein the circuit board includes a conductive sheet spaced apart from the major surface and the bottom surface, and wherein the apparatus further comprises:
   a plurality of plated through-holes extending at least between the bottom surface and the conductive sheet, each of the plurality of plated through-holes being electrically connected to the conductive sheet and the conductive layer.

3. The apparatus of claim 1, wherein the stop surface is non-conductive, and wherein the conductive layer is defined by a non-conductive portion of the bottom surface abutting the stop surface, the non-conductive portion extending at least a length of the stop surface between the opposing sides.

4. The apparatus of claim 1, wherein the multiple conductor ribbon cable is a multiple conductor coaxial cable, wherein each of the plurality of first conductors is a center conductor of the multiple conductor coaxial cable, and wherein each of the plurality of second conductors is an outer conductor of the multiple conductor coaxial cable.

5. The apparatus of claim 4, wherein each of the plurality of center conductors is surrounded by an insulator layer, and wherein the insulator layer surrounding each of the center conductors substantially abuts the stop surface.

6. The apparatus of claim 4, wherein a depth of the recessed portion is such that a respective free end of each of the plurality of center conductors is substantially parallel with the major surface of the circuit board.

7. A method of launching a coaxial cable onto a circuit board, the coaxial cable having a width dimension and a plurality of center conductors, each of the plurality of center conductors being surrounded by an outer conductor and having a free end extending beyond an end of the outer conductor at a terminus of the coaxial cable, the method comprising:
   forming a recessed portion in a major surface of the circuit board, the recessed portion being open to a front edge of the circuit board and being defined by a stop surface, opposing side surfaces, and a bottom surface, a distance between the opposing side surfaces being at least as wide as the width dimension of the coaxial cable;
   forming a plurality of conductive pads on the major surface of the circuit board;
   forming a conductive layer on at least a portion of the bottom surface of the recessed portion;
   connecting the free end of each of the plurality of center conductors to a respective one of the plurality of conductive pads; and
   connecting the outer conductor surrounding each of the center conductors to the conductive layer.

8. The method of claim 7, wherein each of the plurality of center conductors is surrounded by an insulator layer inside of the respective outer conductor, and the method further comprises:
   positioning the coaxial cable within the recessed portion such that the insulator layer surrounding each of the center conductors substantially abuts the stop surface.

9. The method of claim 7, further comprising:
   providing a conductive sheet within the circuit board spaced apart from the major surface and the bottom surface; and
   forming a plurality of plated through-holes extending at least between the bottom surface and the conductive sheet, each of the plated through-holes being electrically connected to the conductive sheet and the conductive layer.

10. The method of claim 7, wherein the stop surface is non-conductive, and the method further comprises:
    defining a non-conductive portion of the conductive layer abutting the stop surface, the non-conductive portion extending at least a length of the stop surface between the opposing sides.

11. The method of claim 7, further comprising:
    positioning the coaxial cable within the recessed portion such that the free end of each of the plurality of center conductors in substantially parallel with the major surface of the circuit board.

12. A coaxial cable and circuit board apparatus, comprising:
    a coaxial cable having a width dimension and a plurality of center conductors, each of the plurality of center conductors being surrounded by an outer conductor and having a free end extending beyond an end of the outer conductor at a terminus of the coaxial cable;
    a circuit board having a front edge and a major surface, the major surface having a recessed portion open to the front edge, the recessed portion being defined by a stop surface, opposing side surfaces, and a bottom surface, a distance between the opposing side surfaces being at least as wide as the width dimension of the coaxial cable;
    a plurality of conductive pads disposed on the major surface; and
    a conductive layer disposed on at least a portion of the bottom surface;
    wherein the free end of each of the plurality of center conductors is connected to a respective one of the plurality of conductive pads and the outer conductor surrounding each of the center conductors is connected to the conductive layer.

13. The apparatus of claim 12, wherein each of the plurality of center conductors is surrounded by an insulator layer inside of the respective outer conductor, and wherein the insulator layer surrounding each of the center conductors substantially abuts the stop surface.

14. The apparatus of claim 12, wherein the circuit board includes a conductive sheet spaced apart from the major surface and the bottom surface, and wherein the apparatus further comprises:
    a plurality of plated through-holes extending at least between the bottom surface and the conductive sheet, each of the plurality of plated through-holes being electrically connected to the conductive sheet and the conductive layer.

15. The apparatus of claim 12, wherein the stop surface is non-conductive, and wherein the conductive layer is defined by a non-conductive portion of the bottom surface abutting the stop surface, the non-conductive portion extending at least a length of the stop surface between the opposing sides.

16. The apparatus of claim 12, wherein the coaxial cable comprises an outer sleeve defining a ribbon coaxial cable.

17. The apparatus of claim 12, wherein a depth of the recessed portion is such that the free end of each of the plurality of center conductors is substantially parallel with the major surface of the circuit board.

* * * * *